United States Patent [19]

Hamano et al.

[11] Patent Number: 5,091,889
[45] Date of Patent: Feb. 25, 1992

[54] SEMICONDUCTOR MEMORY HAVING AN OPERATION MARGIN AGAINST A WRITE RECOVERY TIME

[75] Inventors: Takahiro Hamano, Yamato; Masataka Matsui, Tokyo; Katsuhiko Sato, Yokohama, all of

[73] Assignee: Kabushiki Kaisha Toshiba, Kawasaki, Japan

[21] Appl. No.: 456,452

[22] Filed: Dec. 26, 1989

[30] Foreign Application Priority Data

Dec. 28, 1988 [JP] Japan .................................. 63-333618

[51] Int. Cl.⁵ .......................................... G11C 11/34
[52] U.S. Cl. ................. 365/233.5; 365/203; 365/233
[58] Field of Search ...................... 365/230.01, 230.06, 365/233, 233.5, 203

[56] References Cited
U.S. PATENT DOCUMENTS 4,272,832  6/1981  Ito ..................................... 365/233.5
4,872,143  10/1989 Sumi ................................. 365/233.5
4,916,668  4/1990  Matsui .............................. 365/233 X Primary Examiner—Joseph A. Popek
Attorney, Agent, or Firm—Banner, Birch, McKie & Beckett

[57] ABSTRACT

An address transition detecting circuit detects on address transition signal generated during the writing of input data into a static random access memory (SRAM) and generates an address detection signal as a monostable pulse of a predetermined length. A bit line precharge and equalize signals generating circuit generates, in synchronization with the address transition detection signal and an input signal on a write data line, a bit line precharge signal and bit line equalize signal which are supplied to their columns in memory. At a time of reading, the bit line precharge and equalize signals generating circuit supplies a high level potential to paired data lines to prevent a data entry from being made into the paired write data lines by a resetting operation. At a time of writing, a write data buffer circuit supplies complementary data to the paired write data lines and prevents a data signal entry from being made by a presetting operation onto the paired write data lines, for a predetermined period of time, in synchronization with the address transition detection signal. It is, therefore, possible to prevent an input signal entry for a predetermined period of time by a resetting operation and hence prevent a write error.

15 Claims, 3 Drawing Sheets

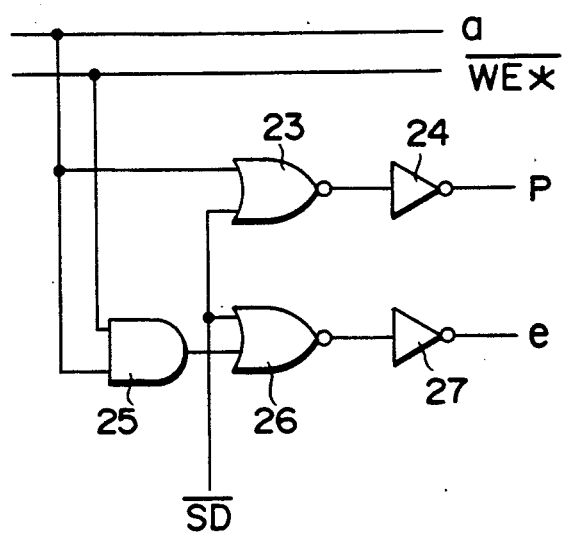
F I G. 3
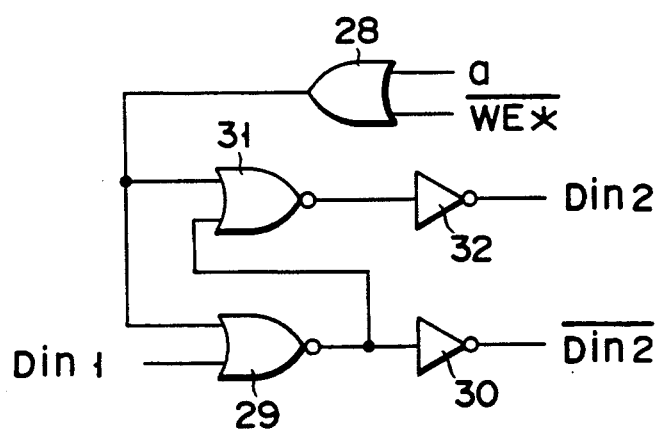
F I G. 4

SEMICONDUCTOR MEMORY HAVING AN OPERATION MARGIN AGAINST A WRITE RECOVERY TIME

BACKGROUND OF THE INVENTION

1. Field of the Invention

The present invention relates to a static semiconductor memory and, in particular, an internal synchronization type static RAM which includes a circuit for separately generating a bit line equalize signal and bit line precharge signal and separately supplying them to the corresponding bit lines for a memory cell and a circuit for preventing an entry of write data from being made, for a predetermined period of time, by a resetting operation and ensures an adequate operation margin against a write recovery time.

2. Description of the Related Art

Of those memories generally called a random access memory (RAM), a static RAM (SRAM) is known which employs memory cells composed of a flip-flop circuit of two cross-connected inverters.

This type of SRAM is disclosed in MASATAKA MATSUI U.S. Pat. No. 4,916,668 entitled "INTERNAL SYNCHRONIZATION TYPE MOS SRAM WITH ADDRESS TRANSITION DETECTING CIRCUIT" issued Apr. 10, 1990 and assigned to Kabushiki Kaisha Toshiba, that is, the same assignee as that of the present invention. The SRAM is also disclosed in "1985 International Solid-State Circuits Conference Digest OF TECHNICAL Papers pp 64, 65A 17ns 64K CMOS RAM with a Schmitt Trigger Sense Amplifier" Kiyofumi Ochii et al.

In the conventional SRAM, a precharge and equalize signals generating circuit is connected to memory cells to generate a precharge signal for precharging the corresponding memory cell and an equalize signal for equalizing the corresponding memory cell. In this SRAM, an ideal design is sought to achieve a write recovery time TWR=0. In this state, the precharge/equalize signal is generated to hold the bit line potential at an intermediate potential level. At this time, the internal write signal is disabled to place a corresponding write transistor pair in the OFF state. It is thus possible to prevent a data write error.

In the real SRAM, an operation margin which establishes a write recovery time TWR≦0 is needed to ensure the write recovery time TWR=0. However, if an address variation occurs before a return of the write signal back to a disabled level, the internal write signal is held in the enabled state and there is a possibility that error data will be written into that memory cell by an address of the next cycle.

That is, since, even in the event of a transition to an address of the next cycle during the data write operation, intermediate potentials appear on the paired bit lines during the generation of a precharge and equalize signals, no write error occurs, but at the completion of the precharge/equalize signal a write error will occur.

SUMMARY OF THE INVENTION

It is accordingly the object of the present invention to provide a static random access memory (SRAM) which can ensure a specification of a write recovery time TRW=0 by the addition of an operation margin which establishes a write recovery time TRW≦0 and can achieve a high-speed operation following a return of a write input signal back to a disabled level.

According to the present invention, there is provided a static random access memory which comprises:

an array of static memory cells arranged as a matrix array in predetermined rows and columns;

word lines connected to the respective memory cells arranged relative to the rows of the memory cell array and selecting the row of the memory cell array;

paired bit lines connected to the respective memory cells arranged relative to the column of the memory array and allowing a data transfer to be made via the memory cell;

paired write data lines for inputting write data to the memory cell;

an address input unit for receiving address signals including row and column address signals;

a row decode unit having input terminals connected to the address input unit and output terminals connected to the corresponding word lines and adapted to decode the address signal coming from the address input unit and to selectively drive the word line;

a column decode unit having input terminals connected to the address input unit and output terminals connected to the corresponding bit lines and adapted to decode the column address signal coming from the address input unit and to selectively drive the corresponding paired bit lines;

an address transition detector, connected to the output terminal of the address input unit, for detecting a transition of the address signal and for generating address transition data as a monostable pulse of predetermined length; and a bit line initializing unit including a bit line precharge and equalize signals generating circuit having input terminals connected to the address transition detector to receive address transition data generated from the address transition detector, the bit line precharge and equalize signals generating circuit separately generating a bit line precharge signal enabled in synchronization with the address transition data and a bit line equalize signal enabled in synchronization with the address transition data when input data is not being written and supplying them to the paired bit lines.

In the aforementioned arrangement, when a write data buffer circuit reads data out of a corresponding memory cell, it supplies a high-level potential to the write data line pair and prevents an entry of the other data from being made into that write data line pair by a resetting operation. Further, the write data buffer circuit is also of such a type that, when data is written into the memory cell, it supplies complementary data to the paired write data lines and, upon the generation of an address transition detection signal during that period of time, prevents an entry of the other data from being made into the paired write data lines by a resetting operation in synchronization with the address transition detection signal.

It is thus possible to ensure the specification of the write recovery time TRW=0 with an operation margin left which establishes a write recovery time TRW≦0. It is also possible to achieve a high-speed return of a write input signal back to a disabled level on the SRAM of the present invention.

BRIEF DESCRIPTION OF THE DRAWINGS

FIG. 3 is a detailed circuit for generating a bit line equalize signal and bit line precharge signal which emerge from the SRAM of FIG. 1; and FIG. 4 is a detailed write data buffer circuit of FIG. 1.

DETAILED DESCRIPTION OF THE PREFERRED EMBODIMENT

Figure 1:
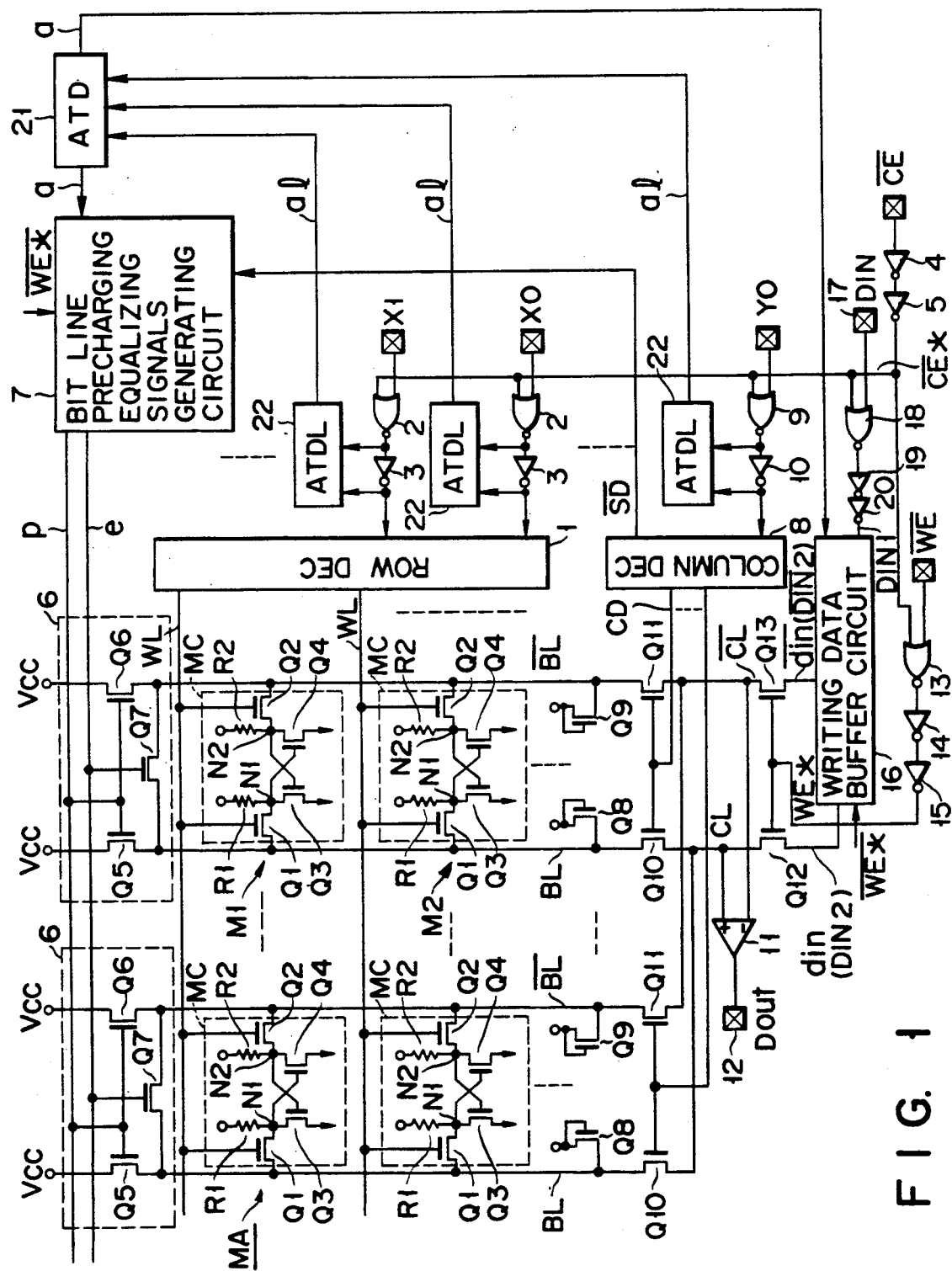
FIG. 1 is a circuit diagram showing an SRAM according to an embodiment of the present invention.

FIG. 1 shows a schematic circuit arrangement of an SRAM according to one embodiment of the present invention. In the circuit arrangement shown in FIG. 1, memory cells M1, M2, . . . are arranged as a matrix array in SRAM, two typical columns being typically shown in FIG. 1 for ease in illustration.

The memory cells M1, M2, . . . are identical in structure to each other, a representative one of these memory cells being explained below. The memory cell M1 comprises a flip-flop comprised of high resistive load elements R1, R2 and N-channel type MOS transistors Q3, Q4 and transfer gate MOS transistors Q1, Q2. The high resistive load elements R1 and R2 are connected at one terminal to a power source, not shown, and at the other terminal to the corresponding current paths of the MOS transistors Q3 and Q4. The other terminal of the current path of the MOS transistor Q3 is grounded and the transistor Q3 has its gate connected to a junction (node N2) of the high resistive load element R2 and MOS transistor Q4. The other terminal of the current path of the MOS transistor Q4 is grounded and the MOS transistor Q4 has its gate connected to a junction (node N1) of the load element R1 and MOS transistor Q3. The MOS transistor Q1 has its current path connected between a bit line BL and the node N1 and its gate connected to a word line WL. The MOS transistor Q2 has its current path connected between a bit line $\overline{BL}$ and the node N2 and its gate connected to the word line WL. The nodes N1 and N2 hold compensation data which, when the MOS transistors Q1 and Q2 are turned ON, are transferred to the bit lines BL and $\overline{BL}$. The memory cell is called a 4-transistor type static memory cell. The memory cell M1 may employ two MOS transistors in place of the load elements R1 and R2 in which case the memory cell M1 is called a 6-transistor type static memory cell. The word line WL is selectively driven by the output of a row decoder 1. Row address signals X0, X1, . . . are supplied to the row decoder 1 via an NOR gate 2 and inverter 3. A chip enable signal $\overline{CE}$ is supplied as an internal chip enable signal CE* via inverters 4 and 5. The row address signals X0, X1, . . . are supplied via an NOR gate 2 and inverter 3 to the row decoder 1 when they are in a low level and inhibited from entering the row decoder 1 when they are in a high state. A bit line precharge/equalize circuit 6 is provided at one end of the respective paired bit lines. The bit line precharge/equalize circuit 6 comprises bit line precharge MOS transistors Q5, Q6 and a bit line equalize MOS transistor Q7. The gates of the bit line precharge MOS transistors Q5 and Q6 are connected to each other and a bit line precharge signal "p" is delivered, as an output signal, from the precharge and equalize signals generating circuit 7. The precharge and equalize signals generating circuit 7 can individually generate the bit line precharge signal "p" and bit line equalize signal "e". The bit line equalize signal "e" is supplied to the gate of the bit line equalize MOS transistor Q7. A bit line pull-up MOS transistor Q8 has its current path connected between the bit line BL and the power source Vcc and its gate connected to the power source Vcc. A bit line pull-up MOS transistor Q9 has its current path connected between the bit line $\overline{BL}$ and the power source Vcc and its gate to the power source Vcc. The MOS transistors Q8 and Q9 are placed in a normally ON state and set a potential difference "V" between the bit lines BL and $\overline{BL}$. One end of the current path of a column transfer gate MOS transistor Q10 is connected to the other end of the bit line BL. One end of the current path of a column transfer gate MOS transistor Q11 is connected to the other end of the bit line $\overline{BL}$. The other end of the current path of the MOS transistor Q10 is connected to a common bit line CL and the other end of the current path of the MOS transistor Q11 is connected to a common bit line $\overline{CL}$. The MOS transistors Q10 and Q11 have their gates connected commonly and are selectively ON-controlled with a column select signal CD which is output from an ordinary column decoder 8. The column decoder 8 sends a section select signal $\overline{SD}$ to the precharge and equalize signals generating circuit 7.

A column address Y0, . . . is sent to the column decoder 8 via a NOR gate 9 and inverter 10. The internal chip enable signal $\overline{CE^*}$ is sent to the NOR gate 9. The column address Y0, . . . is sent to the column decoder 8 via the NOR gate 9 and inverter 10 when the chip enable signal $\overline{CE^*}$ is at a low level and inhibited from entering the column decoder 8 when the chip enable signal is at a high level. The input of a sense amplifier 11 is connected to the common bit lines CL and $\overline{CL}$. An output terminal Dout of the sense amplifier 11 is output via an output terminal 12. One end of the current path of the transfer gate MOS transistors (write MOS transistors) Q12, Q13 is connected to a corresponding one of the common bit lines CL and $\overline{CL}$. The MOS transistors Q12 and Q13 have their gates connected to each other and ON-controlled upon receipt of an internal write enable signal WE*. The internal write enable signal WE* is generated based on a chip enable signal $\overline{CE}$ and write enable signal $\overline{WE}$. The write enable signal $\overline{WE}$ is supplied to one input terminal of a NOR gate 13 and the chip enable signal $\overline{CE}$ is supplied to the NOR gate 13 via the inverters 4 and 5. The output of the NOR gate 13 is supplied, as the internal write enable signal WE*, to the gates of the MOS transistors Q12 and Q13 via inverters 14 and 15. Write data Din2 is supplied from a write data buffer circuit 16 to the other end of the current path of the MOS transistor Q12 via a data line din. Write data $\overline{Din2}$ is supplied from the write data buffer circuit 16 to the other end of the current path of the MOS transistor Q13 via a data line $\overline{din}$. Write data Din is supplied as write data Din1 from an input terminal 17 to the write data buffer circuit 16 via NOR gate 18 and inverters 19 and 20. The internal chip enable signal $\overline{CE^*}$ is also supplied to the input terminal of the NOR gate 18. The write data buffer circuit 16 is connected to an address transition detector (ATD) 21 as will be set forth below and receives address transition data "a", for synchronization, when the data "a" is generated. The input terminal of the address transition detector (ATDL) 22 is connected to the input and output terminals of a respective inverter 3 and of inverter 10. The address transition detector (ATDL) 22 is of the same type as a circuit for detecting the transition of an address signal which is ordinarily employed in the art. The address transition detector (ATDL) 22 detects a variation of row address signals X0, X1, ... and column address Y0 and delivers an address transition detection signal "a1".

The address transition detection signals al are supplied to the address transition detector (ATD) 21. The address transition detection signals "a1" are ORed by the address transition detector (ATD) 21 and address transition data "a" is supplied, as a monostable pulse of predetermined length, to the precharge and equalize signals generating circuit 7 in the next stage. The precharge and equalize signals generating circuit 7 supplies a bit line precharge signal "p", which is obtained by processing the address transition data, and bit line equalize signal "e" to the precharge/equalize circuit 6 in each column.

The precharge and equalize signals generating circuit 7 receives an inverted replica $\overline{WE^*}$ of a write signal WE applied from an external source, address transition data a coming from the address transition circuit (ATD) 21 and section select signal $\overline{SD}$ coming from the column decoder 8 and delivers a bit line precharge signal "p" and bit line equalize signal "e".

The operation of the aforementioned embodiment will be explained below.

When a chip enable signal $\overline{CE}$ goes low, row address signals XO, X1, ... and column address signals Y0, ... become enabled. The row address signals X0, X1, ... are supplied to the row decoder 1 via the NOR gate 2 and inverter 3. Column address Y0, ... are supplied via the NOR gate 9 and inverter 10 to the column decoder 8. When a variation of the address signals X0, X1, ... and that of Y0, ... are detected by the address transition detector (ATDL) 22, an address transition detection signal "a1" is delivered as an output to the address transition detector (ATD) 21. The address transition detector (ATD) 21 takes a logical sum of the address transition detection signals "a1" and supplies an address transition data "a", as a monostable pulse of predetermined length, to the precharge and equalize signals generating circuit 7. The bit line precharge signal "p" and bit line equalize signal "e" are supplied to the bit line precharge/equalize circuit 6. The bit line precharge/equalize circuit 6 is enabled, that is, becomes a "1" level in synchronism with the address transition data "a". That is, the MOS transistors Q5, Q6 and Q7 are turned ON and the same potential appears on the bit lines BL and $\overline{BL}$ in synchronism with a variation of the address transition data "a". Thus previous address data are quickly reset.

The row decoder 1 decodes the row address signals XO, X1, . . ., in parallel with the equalize operation, resulting in a selection of one word line WL. A high level ("1" level) appears on the selected word line WL, turning on the transfer gate MOS transistors Q1 and Q2 in the memory cell M1 on that row which is connected to the word line WL. Compensation data is held on the nodes N1 and N2 and read onto the bit lines BL and $\overline{BL}$.

The column decoder 8 decodes the column address Y0, ... and a column select signal CD on a corresponding selected column becomes a high level ("1" level). The transfer gate MOS transistors Q10 and Q11 on the selected column are turned ON, connecting the selected bit lines BL and $\overline{BL}$ to the common bit lines CL and $\overline{CL}$, respectively. The data of the memory cell M1 which are read onto the common bit lines CL and $\overline{CL}$ are amplified by the sense amplifier 11. An amplified signal emerges, as an output signal Dout, from the output terminal 12.

The write operation is different from the conventional operation in the following respects.

The bit line precharge signal "p" of the precharge and equalize signals generating circuit 7 becomes enabled ("1" level), for either of the read and write operation periods, in interlocking with the address transition data "a".

Similarly, the bit line equalize signal "e" becomes enabled, for the read period, in synchronization with the address transition data "a" and is not enabled, for the write period, in synchronization with the address transition data "a".

In the present embodiment, it is possible to separately output the bit line precharge signal "p" and bit line equalize signal "e", with the use of the bit line precharge and equalize signals generating circuit 7, the bit line precharge signal "p" being enabled in synchronization with the address transition data "a" and the bit line equalize signal "e" being enabled in synchronization with the address transition data "a".

The SRAM of the present invention applies a high level potential to the write data lines din, $\overline{din}$ at a read time to reset them, and supplies complementary data to the write data lines din, $\overline{din}$ for a write time, the SRAM functioning in synchronization with the address transition data "a" to reset the write data lines when the address transition data "a" is generated for the write time.

Figure 2:
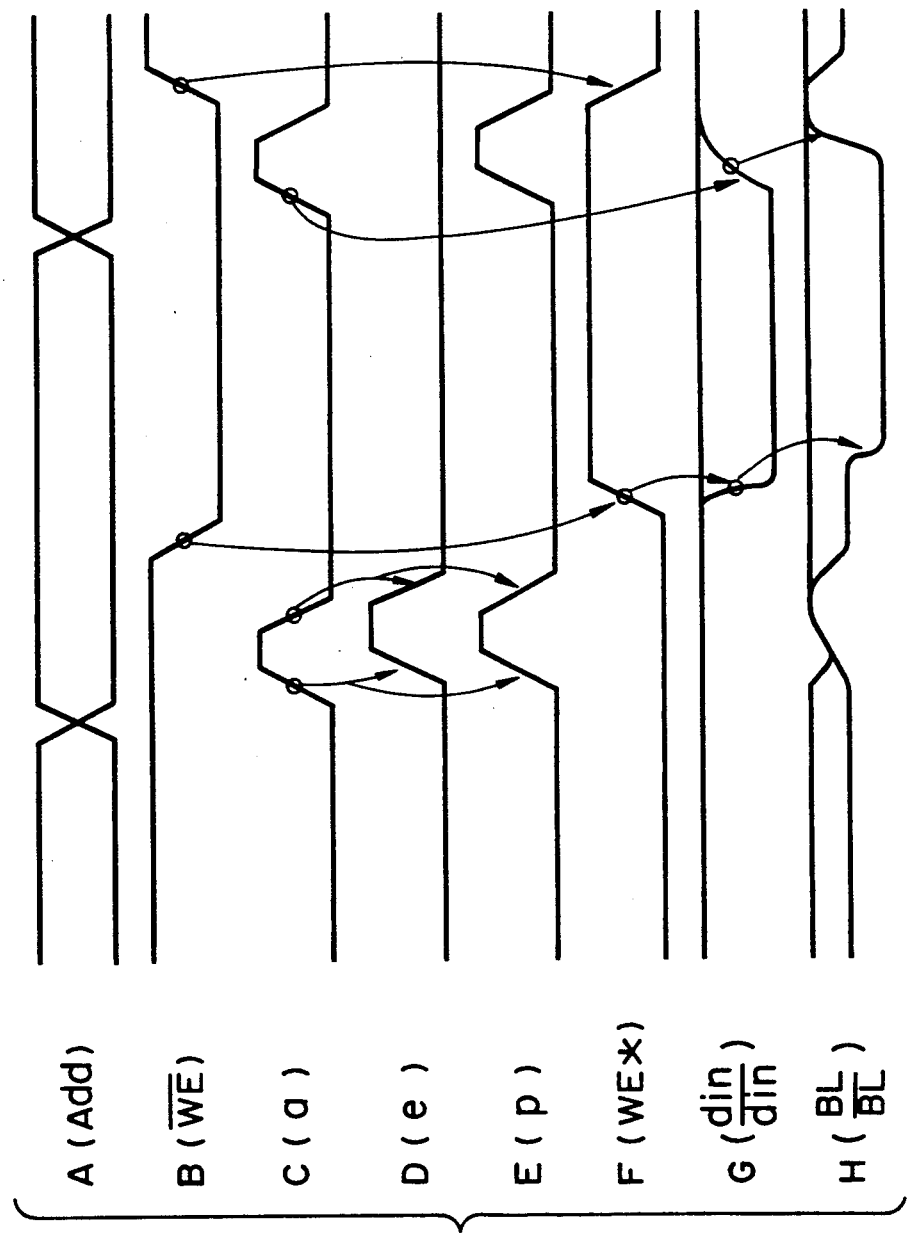
FIG. 2 is a timing chart showing a write operation state of the SRAM of FIG. 1.

FIG. 2 shows a write operation timing chart at the write recovery time TWR<0. That is, if, during the write operation, an address signal Add (see A in FIG. 2) is followed by an address signal add in the next cycle and, at that time, address transition data "a" (see C in FIG. 2) is produced, then a bit line precharge signal "p" (see E in FIG. 2) becomes an enabled level "1" in synchronization with the address transition data "a". The bit line precharge MOS transistors Q5 and Q6 are turned ON and a high level "1" appears on the bit lines BL and $\overline{BL}$ (see H in FIG. 2). On the other hand, a bit line equalize signal (D in FIG. 2) is not equalized and held at a "0" level. Thus no equalization occurs on the bit lines BL and $\overline{BL}$.

Thus a high level "1" is held on the bit lines BL and $\overline{BL}$ and, during a predetermined period, the write data lines din and $\overline{din}$ (see G in FIG. 2) is placed in a reset state and no write error occurs. Since no equalization occurs on the bit lines BL, $\overline{BL}$, it is not necessary, according to the present invention, to produce a potential variation on the bit lines BL, $\overline{BL}$ as in the conventional device. It is thus possible to transfer a read operation to the next one at a high rate of speed. In this way, the specification of a write recovery time TWR=0 can be ensured by the addition of a proper operation margin which establishes a write recovery time TWR≦0.

Since, in synchronism with the address transition data "a", the reset operation is performed, for a predetermined time, by the write data buffer circuit 16 to cause a "1" level to emerge on the bit lines BL, $\overline{BL}$, an operation following a return of the write signal $\overline{WE}$ to a disabled level "1" can be achieved at a high rate of speed.

Further, it is possible to apply the bit line initializing means and write data buffer circuit to not only the SRAM but also a random access memory. For example, an operation margin can be ensured against the write recovery time with the use of a single memory cell.

FIG. 3 shows on form of the precharge and equalize signals generating circuit. An address transition data "a" and section select signal $\overline{SD}$ are supplied via the corresponding lines to a first NOR gate 23 and an output of the first NOR gate 23 is connected to the input of a first inverter 24. The first inverter 24 inverts an output signal of the first NOR gate 23 to produce a bit line precharge signal "p".

The address transition data "a" and internal write signal $\overline{WE^*}$ are supplied via the corresponding lines to an AND gate 25. The output of the AND gate 25 is connected to one input of a second NOR gate 26 and the section select signal $\overline{SD}$ is supplied via the corresponding line to the other input of the second NOR gate 26. The output of the first NOR gate 26 is connected to the input of a second inverter 27. The second inverter 27 inverts an output signal of the first NOR gate 26 to produce a bit line equalize signal "e".

The operation of the precharge and equalize signals generation circuit 7 at a read time and write time will be explained below.

At the read time, an inverted replica $\overline{WE^*}$ of the internal write signal WE* becomes a "1" level and is supplied to the AND gate 25. The address transition data "a" of a "1" level is fed to the first NOR gate 23 and AND gate 25. The "1" level signal is delivered from the AND gate 25 to the NOR gate 26. Since, in the selected section, the section select signal $\overline{SD}$ becomes an enabled "0" level, an output is sent to the inverters 24 and 27. The first inverter 24 delivers a bit line precharge signal p of a "1" level and the bit line equalize signal "e" of the "1" level is output from the second NOR gate 26.

At the write time, the section select signal $\overline{SD}$ becomes a "0" level and the inverted signal $\overline{WE^*}$ becomes a "0" level. For this reason, the output of the AND gate 25 becomes a "0" level irrespective of the level of the address transition data a and the bit line equalize signal "e" becomes a "0" level. Even if the address transition data a becomes a "1" level, the bit line precharge signal "p" only becomes a "1" level and the bit line equalize signal "e" is hold at the "0" level.

FIG. 4 shows one form of the aforementioned write data buffer circuit. That is, an address transition data "a" and an inverted replica $\overline{WE^*}$ of an internal write signal WE* are supplied to the inputs of an OR gate 28. The output of the OR gate 28 is input to one input terminal of a first OR gate 29 and write data Din1 is input to the other input of the NOR gate 29. The output of the first NOR gate 29 is input to the input of a first inverter 30 and the output of the inverter 30 is delivered as write data Din2.

A second NOR gate 31 receives the address transition data "a" and the output of the NOR gate 29 and delivers an output to the input of a second inverter 32. The second inverter 32 delivers an output as write data $\overline{Din2}$ which is complementary to the write data Din2.

The operation of the write data buffer circuit at the read time and at the write time will be explained below. Since, at the read time, signal $\overline{WE^*}$ becomes a "1" level, the output of the OR gate becomes a "1" level irrespective of the level of the address transition data "a". The "1" level signal of the OR gate 28 is supplied to the corresponding input of the first NOR gate 29 and the data Din2 is input to the corresponding input of the first NOR gate 29. Thus the first NOR gate 29 delivers a "0" level signal to the first inverter 30 irrespective of the level of the write data Din1 and the first inverter 30 delivers write data $\overline{Din2}$ as a "1" level signal. The "1" level signal is input from the OR gate 28 to the corresponding input of the NOR gate 31 and the output of the NOR gate 29 is input to the corresponding input of the NOR gate 31. For this reason, the second NOR gate 31 delivers a "0" level signal to the second inverter 32 irrespective of a variation in the output level of the first NOR gate 32. Write data Din2 is delivered as a "1" level signal from the second inverter 32. These write data Din2 and $\overline{Din2}$ are reset by such a series of operation.

Since, at the write time, the inverted signal $\overline{WE^*}$ is in the "0" level, the OR gate 28 becomes a "0" level when the address transition data "a" is a "0" level signal. For this reason, a variation level of the write data Din2 is output from the first inverter 30 via the first NOR gate 29. Further, the output level of the first NOR gate 29 is delivered, as write data Din2, from the second inverter 32 via the second NOR gate 31, the data $\overline{Din2}$ being complementary to the write data Din2. In this way, the level of the write data Din1 is output as the write data Din2 and $\overline{Din2}$ via the corresponding lines.

When the address transition data "a" is a "1" level signal at the write time, the "1" level signal is output from the OR gate 28. The "1" level signal is sent from the OR gate 28 to the NOR gate 31 which sends "0" to the second inverter 32 and the write data Din2 emerges, as a "1" level signal, from the inverter 32. The "1" level output of the OR gate 28, being not restricted by the level of the write data Din1, is sent via the first NOR gate 29 to the first inverter 30 where the write data $\overline{Din2}$ emerges as a "1" level signal.

The SRAM of the present invention is the same as that of the conventional counterpart at the read time, but when the address transition data "a" is generated at the write time in particular the address transition data a is synchronized with the write data Din1 to let the paired write data din, $\overline{din}$ become a high level and the data input is reset for a predetermined period of time so that no write error takes place. Further, since the bit lines BL, $\overline{BL}$ are not equalized and hence it is not necessary to vary the potentials BL, $\overline{BL}$ on the bit lines as in the conventional case, it is possible to make a high-speed transfer to the next read cycle operation. Thus the specification TWR=0 can be ensured by the addition of a proper operation margin which establishes a write recovery time TWR≦0.

In synchronism with the address transition data "a", the paired data lines din, $\overline{din}$ go high in the write data buffer circuit and data input is reset for a predetermined period of time. Since the paired bit lines BL, $\overline{BL}$ are both rendered in a "1" level, it is possible to achieve a high-speed return of the write signal $\overline{WE^*}$ back to a disabled "1" level. It is to be understood by those skilled in the art that the foregoing description is not intended to be limiting, but is merely descriptive of the preferred embodiments of the disclosed device. Various changes and modifications may be made to the invention without departing from the spirit and scope thereof.

What is claimed is:

1. A static random access memory comprising:
   an array of static memory cells arranged in rows and columns;
   word lines coupled to the respective memory cells arranged relative to the rows of the memory cell array for selecting a row of the memory cell array;
   paired bit lines coupled to the respective memory cells arranged relative to the columns of the memory cell array for allowing data transfer to and from the memory cell array;

paired write data lines for inputting write data to a memory cell of said array;

address input means for receiving address signals including row and column address signals;

row decoder means having input terminals coupled to the address input means and output terminals coupled to the word lines for decoding the row address signals from the address input means and for selectively driving a word line in accordance with the row address signals;

column decoder means having input terminals coupled to the address input means and output terminals coupled to the bit lines for decoding the column address signals from the address input means and for selectively driving paired bit lines in accordance with the column address signals;

address transition detecting means, coupled to said address input means, for detecting a transition of the address signals and for generating address transition data; and bit line initializing means including a bit line precharge and equalize signals generating circuit having an input terminal connected to the address transition detecting means to receive address transition data generated from the address transition detecting means, said bit line precharge and equalize signals generating circuit respectively generating a bit line precharge signal enabled in synchronization with the address transition data and a bit line equalize signal separate from said precharge signal and enabled in synchronization with the address transition data during the read period of said static random access memory.

2. The static random access memory according to claim 1, wherein said bit line initializing means includes a transistor having its gate supplied with said bit line equalize signal and its drain/source circuit coupled between a pair of said paired bit lines.

3. The static random access memory according to claim 2, wherein said bit line initializing means further includes a pair of transistors and a bit line precharge power source, said pair of transistors having their gates coupled to each other to receive said bit line precharge signal generated from the bit line precharge and equalize signal generating circuit and having their drains and sources coupled between said bit line precharge power source and said bit line pair.

4. The static random access memory according to claim 3, wherein said bit line precharge and equalize signal generating circuit comprises:

a bit line precharge signal generating circuit section comprising a first NOR gate having its output coupled to an input of a first inverter, said NOR gate arranged to receive, at its input, said address transition data and a section select signal coming from said column decoder means and said first inverter generating, at its output, said bit line precharge signal; and a bit line equalize signal generating circuit section comprising an AND gate, a second NOR gate and a second inverter to receive, at inputs of the AND gate, said address transition data and an internal write signal and to generate said bit line equalize signal from an output of the second inverter, said second NOR gate and said second inverter being coupled its series to the output terminal of the AND gate.

5. The static random access memory according to claim 1, further including write data buffering means coupled in said paired write data lines, for supplying complementary data to said paired write data lines when data is written to a memory cell of said memory and for, in synchronization with said address transition data, preventing an entry of write data into corresponding paired write data lines for a predetermined period of time by a resetting operation.

6. The static random access memory according to claim 5, wherein said write data buffering means includes a write data buffer circuit which, when data is read from a memory cell of said memory, supplies a high level potential to said corresponding paired write data lines to prevent an entry of other data from being made into the paired write data lines.

7. The static random access memory according to claim 6, wherein said write data buffering means includes a pair of transistors having their gates coupled to each other and supplied with an internal write signal which is enabled at a write time and a having their drains and sources connected between a pair of said write data lines and a pair of said paired bit lines.

8. The static random access memory according to claim 5 wherein during said resetting operation, said write data buffering means supplies a high level potential to said corresponding paired write data lines.

9. An addressable semiconductor memory comprising:

first and second memory cells;

paired bit lines coupled to each of said first and second memory cells;

a bit line initializing circuit;

a write data buffer circuit respectively coupled to the paired bit lines; and means for preventing write error by the addition of a margin of time during which entry of data to said first memory cell is prevented in synchronization with an address transition from said first memory cell to said second memory cell to provide for a write recovery period.

10. The semiconductor memory of claim 9 wherein said bit line initializing circuit includes a bit line precharge and equalize signals generating circuit which separately generates a bit line precharge signal in synchronization with an address transition within said array and an equalize signal in synchronization with an address transition within said array during he read period of said addressable memory.

11. A bit line initializing circuit for a static random access memory comprising an array of static memory cells arranged in rows and columns, word lines respectively coupled to the memory cells in each row of said memory cell array, paired bit lines respectively coupled to the memory cells in each column of said memory cell array, addressing means for addressing the memory cells of said memory cell array, and means for detecting a transition in address data, said bit line initializing circuit including means for respectively generating a bit line precharge signal enabled in synchronization with a transition in address data and a bit line equalize signal separate from said precharge signal and enabled in synchronization with a transition in address data during the read period of said static random access memory.

12. A static random access memory comprising:

an array of static memory cells arranged in rows and columns;

word lines coupled to the respective memory cells arranged relative to the rows of the memory cell array for selecting a row of the memory cell array;

paired bit lines coupled to the respective memory cells arranged relative to the columns of the memory cell array for allowing data transfer to and from the memory cell array;

paired write data lines for inputting write data to a memory cell said array;

address input means for receiving address signals including row and column address signals;

row decoder means having input terminals coupled to the address input means and output terminals coupled to the word lines for decoding the row address signals from the address input means and for selectively driving a word line in accordance with the row address signals;

column decoder means having input terminals coupled to the address input means and output terminals coupled to the bit lines for decoding the column address signals for the address input means and for selectively driving paired bit line in accordance with the column address signals;

address transition detecting means, coupled to said address input means, for detecting a transition of the address signals and for generating address transition data; and write data buffering means coupled to said paired write data lines of each memory cell, for supplying data to said paired write data lines and for, in synchronization with an address transition within said array, preventing an entry of write data for a predetermined period of time into said paired write data lines by a resetting operation.

13. A write data buffering circuit for a static random access memory comprising an array of static memory cells arranged in rows and columns, word lines respectively coupled to the memory cells in each row of said memory cell array, paired bit lines respectively coupled to the memory cells in each column of said memory cell array, means for addressing the memory cells within said memory cell array, paired write data lines for inputting write data to a memory cell of said array, and means coupled to said write data buffering circuit for detecting a transition in address data, said write data buffering circuit comprising:

write data buffering means coupled to said paired write data lines of each memory cell for supplying data to said paired write data lines and for, in synchronization with an address transition within said array, preventing an entry of write data for a predetermined period of time into said paired write data lines by a resetting operation.

14. A static random access memory comprising:
a memory cell array including static memory cells arranged in a row and column matrix;

a plurality of word lines arranged such that static memory cells in a given row of said matrix are coupled to a same row line;

a plurality of bit line pairs arranged such that static memory cells in a given column of said matrix are coupled to a same bit line pair;

row addressing means coupled to said plurality of row lines for addressing one of said row lines in accordance with row address data;

column addressing means coupled to said plurality of bit line pairs for addressing one of said bit line pairs in accordance with column address data;

address transition detecting means for detecting a transition of the row and column address data to generate an address transition signal;

a signal generating circuit responsive to the address transition signal for selectively initializing potentials of said bit line pairs and for selectively equalizing potentials on said bit line pairs;

a data line pair coupled to said paired bit lines;

transfer gates responsive to a first level of a write enable signal for permitting the transfer of data from said data line pair to said paired bit lines and to a second level of the write enable signal for inhibiting the transfer of data from said data line pair to said paired bit lines; and a write data buffer circuit coupled to said data line pair, said write data buffer circuit supplying a predetermined potential to said data line pair to reset said data line pair when the level of the write enable signal is substantially equal to the second level and for supplying the write data to said data line pair for writing the write data to a memory cell addressed in accordance with row and column address data when the level of the write enable signal is substantially equal to the first level, said write data buffer further supplying the predetermined potential to said data line pair for a predetermined time period in synchronization with an address transition signal generated by said address transition detecting means when the level of the write enable signal is substantially equal to the first level.

15. A static random access memory according to claim 14 and further comprising:
bit line initializing means including a bit line precharge and equalize signal generating circuit having input terminals connected to the address transition detecting means to receive address transition data generated from the address transition detecting means, said bit line precharge and equalize signal generating circuit respectively generating a bit line precharge signal enabled to synchronization with the address transition data and a bit line equalize signal enabled in synchronization with the address transition data during the read period of said static random access memory.

* * * * *